United States Patent
Harrison

(10) Patent No.: US 9,459,332 B2
(45) Date of Patent: Oct. 4, 2016

(54) INDIRECT COOLING TYPE SUPERCONDUCTING MAGNET APPARATUS

(71) Applicant: Samsung Electronics Co., Ltd., Gyeonggi-do (KR)

(72) Inventor: Stephen M. Harrison, Wallingford (GB)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 477 days.

(21) Appl. No.: 14/260,349

(22) Filed: Apr. 24, 2014

(65) Prior Publication Data

US 2015/0160314 A1 Jun. 11, 2015

(30) Foreign Application Priority Data

Jul. 3, 2013 (KR) .................. 10-2013-0077941

(51) Int. Cl.
*H01F 6/04* (2006.01)
*H01F 6/06* (2006.01)
*G01R 33/38* (2006.01)
*G01R 33/3815* (2006.01)

(52) U.S. Cl.
CPC ............. *G01R 33/3804* (2013.01); *H01F 6/04* (2013.01); *H01F 6/06* (2013.01); *F25B 2400/17* (2013.01); *G01R 33/3815* (2013.01)

(58) Field of Classification Search
CPC . G01R 33/3804; G01R 33/3815; H01F 6/04; H01F 6/06; F25B 2400/17
See application file for complete search history.

(56) References Cited

U.S. PATENT DOCUMENTS

| | | | |
|---|---|---|---|
| 5,325,080 A | 6/1994 | Chandratilleke et al. | |
| 7,053,740 B1 | 5/2006 | Laskaris et al. | |
| 2005/0077898 A1* | 4/2005 | Nemoto | G01R 33/3815 324/318 |
| 2007/0257754 A1 | 11/2007 | Gilgrass | |
| 2014/0114175 A1 | 4/2014 | Harrison | |

FOREIGN PATENT DOCUMENTS

| | | |
|---|---|---|
| JP | 6-48646 B2 | 6/1994 |
| JP | 2859427 B2 | 12/1998 |
| JP | 2005-116956 A | 4/2005 |
| KR | 10-2013-0039445 A | 4/2013 |

* cited by examiner

*Primary Examiner* — Colleen Dunn
(74) *Attorney, Agent, or Firm* — Cha & Reiter, LLC

(57) ABSTRACT

A superconducting magnet apparatus comprises a superconducting coil, a superconducting magnet cooling module comprising a heat shunt for thermally contacting the superconducting coil, and a cooling channel for cooling the heat shunt by contacting the heat shunt. A refrigerator cools the cooling channel and the heat shunt comprises a contact portion surrounding at least a part of a surface of the superconducting coil, and a protruding portion externally extending from the contact portion to contact the cooling channel.

19 Claims, 3 Drawing Sheets

INDIRECT COOLING TYPE SUPERCONDUCTING MAGNET APPARATUS

CLAIM OF PRIORITY

This application claims the benefit of Korean Patent Application No. 10-2013-0077941, filed on Jul. 3, 2013, in the Korean Intellectual Property Office, the disclosure of which is incorporated herein in its entirety by reference.

BACKGROUND

1. Technical Field

A system concerns a superconducting magnet employing an indirect cooling type superconducting magnet cooling module.

2. Description of Related Art

A superconducting apparatus, such as used by a magnet resonance imaging (MRI) apparatus or a nuclear magnetic resonance (NMR) apparatus, uses a superconducting magnet. A superconducting magnet maintains superconduction at an extremely low temperature, such as 4.2 K, using a cooling system. A known bath cooling system directly cools a superconducting magnet in a bath containing liquid helium. However, the bath cooling system requires a large amount of liquid helium (for example, 2,000 liters) to fill the bath, and the liquid helium may be excessively consumed due to heat generated while driving a superconducting magnet apparatus or while charging or discharging the superconducting magnet. Other known cooling systems include thermosiphon type or cryogen-free type cooling but involve additional complexity and associated deficiencies.

SUMMARY

A system includes a superconducting magnet apparatus having an improved cooling efficiency with an advantageous cooling structure of an indirect cooling type refrigerator. Additional aspects will be set forth in part in the description which follows and, in part, will be apparent from the description.

A superconducting magnet apparatus comprises a superconducting coil, a superconducting magnet cooling module comprising a heat shunt for thermally contacting the superconducting coil, and a cooling channel for cooling the heat shunt by contacting the heat shunt. A refrigerator cools the cooling channel and the heat shunt comprises a contact portion surrounding at least a part of a surface of the superconducting coil, and a protruding portion externally extending from the contact portion to contact the cooling channel.

In a feature, the heat shunt comprises a thin plate and is bent to conform to an external shape of the superconducting coil. A cross section of the superconducting coil has a rectangular ring shape, and the contact portion of the heat shunt is attached to at least one of, an inner surface, two side surfaces, and an outer surface, of the superconducting coil. The heat shunt comprises a plurality of strip plates arranged in parallel along the superconducting coil and is formed of a thermal conductor comprising at least one of, copper and aluminum and is flexible.

In another feature, a fluid path for a refrigerant comprising liquid helium is formed in the cooling channel formed of a conductive material. An eddy current reducing section for reducing an eddy current by a magnetic field generated in the superconducting coil is incorporated in the cooling channel in a length direction. The eddy current reducing section is formed of a relatively electrically nonconductive material (comprising stainless steel or alumina) compared to the electrically conductive material forming the cooling channel. The cooling channel is formed of a thermally conductive material. The superconducting magnet apparatus is a magnetic resonance imaging (MIR) apparatus.

In yet another feature, a superconducting magnet apparatus comprises a superconducting coil, a superconducting magnet cooling module comprising a heat shunt for thermally contacting the superconducting coil, and a cooling channel for cooling the heat shunt by contacting the heat shunt. The cooling channel incorporates an eddy current reducing section for reducing an eddy current by a magnetic field generated in the superconducting coil. A refrigerator cools the cooling channel and the heat shunt comprises a contact portion surrounding at least a part of a surface of the superconducting coil, and a protruding portion externally extending from the contact portion to contact the cooling channel.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
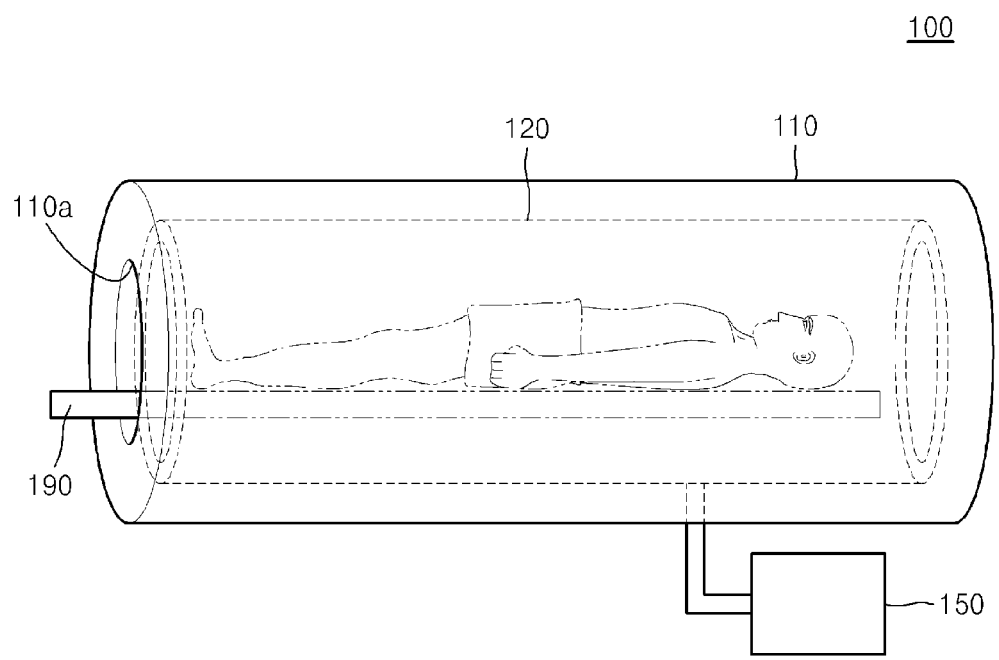
FIG. 1 shows a superconducting magnet apparatus according to invention principles.

Advantages and features of the system may be understood more readily by reference to the following detailed description of the embodiments and the accompanying drawings. In this regard, the present embodiments may have different forms and should not be construed as being limited to the descriptions set forth herein. Rather, these embodiments are provided so that this disclosure will be thorough and complete to one of ordinary skill in the art. Like reference numerals refer to like elements throughout the specification.

All terms including descriptive or technical terms which are used herein should be construed as having meanings attributable by one of ordinary skill in the art. Also, some terms may be selected by the applicant, and in this case, the meaning of the selected terms will be described in detail in the detailed description of the invention. Thus, the terms used herein are to be interpreted based on the meaning of the terms together with the description throughout the specification. When a part "includes" or "comprises" an element, unless there is a particular description contrary thereto, the part can further include other elements, not excluding the other elements.

Reference will now be made in detail to embodiments, examples of which are illustrated in the accompanying drawings. In this regard, the present embodiments may have different forms and should not be construed as being limited to the descriptions set forth herein. In the following description, well-known functions or constructions are not described in detail since they would obscure the embodiments with unnecessary detail.

Figure 2:
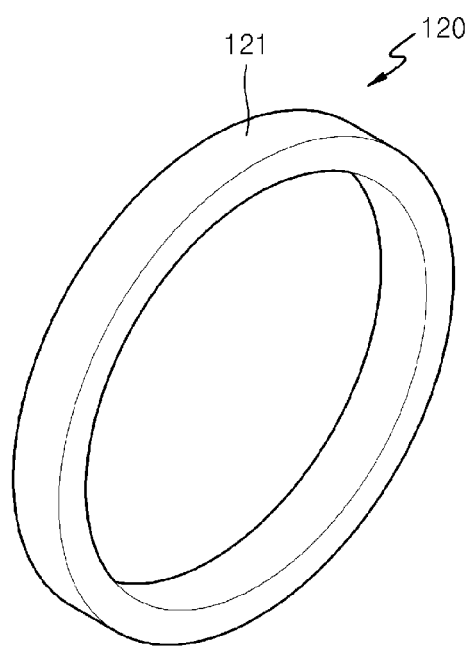
FIG. 2 shows a superconducting coil in the superconducting magnet apparatus of FIG. 1 according to invention principles.

FIG. 1 shows a superconducting magnet apparatus 100 including a housing 110, a superconducting magnet 120 provided in the housing 110, and a cryocooler 150 for cooling the superconducting magnet 120. The superconducting magnet 120 may be formed as superconducting coils 121 made of a superconductor as shown in FIG. 2 arranged in a length direction. The cryocooler 150 maintains a superconducting state by cooling down the superconducting magnet 120 to an extremely low temperature. A detailed structure for cooling down the superconducting magnet 120 is described later. When a current is applied to the superconducting magnet 120, the superconducting magnet 120 generates an inwardly strong magnetic field.

Such a superconducting magnet apparatus 100 may be used in a magnetic resonance imaging (MRI) apparatus. For example, the housing 110 may have a cylindrical structure having a bore 110a, and a table 190 used for inserting a subject into the bore 110a. Housing 110 also includes a gradient coil used to provide location information using a magnetic field by applying a gradient magnetic field, and includes a radio frequency (RF) coil used to apply electromagnetic waves to a body and receive an echo magnetic resonance signal in response to resonance of a magnetization vector in the body of the subject. The gradient coil and the RF coil of an MRI system are well known to one of ordinary skill in the art and do not limit an embodiment of the present invention.

FIG. 2 shows superconducting coil 121 in the superconducting magnet apparatus 120 of FIG. 1. The superconducting coil 121 may have a ring shape, and in detail, a cross section of the ring shape may be rectangular. Such a superconducting coil 121 may be formed by winding a superconducting wire on a ring shape mandrel a plurality of times, and fixing the superconducting wire by impregnating the ring shape mandrel in resin.

Figure 3:
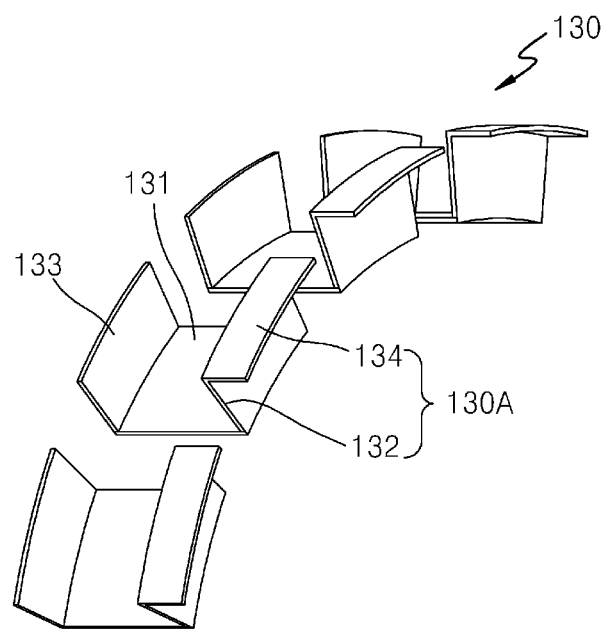
FIG. 3 shows a heat shunt for cooling the superconducting coil of FIG. 2 according to invention principles.
Figure 4:
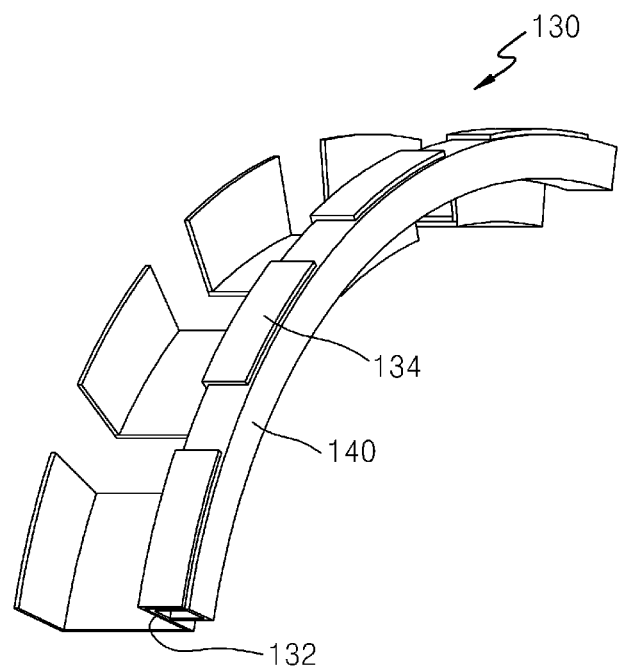
FIG. 4 shows a superconducting magnet cooling module in which a cooling channel is combined with the heat shunt of FIG. 3 according to invention principles.
Figure 5:
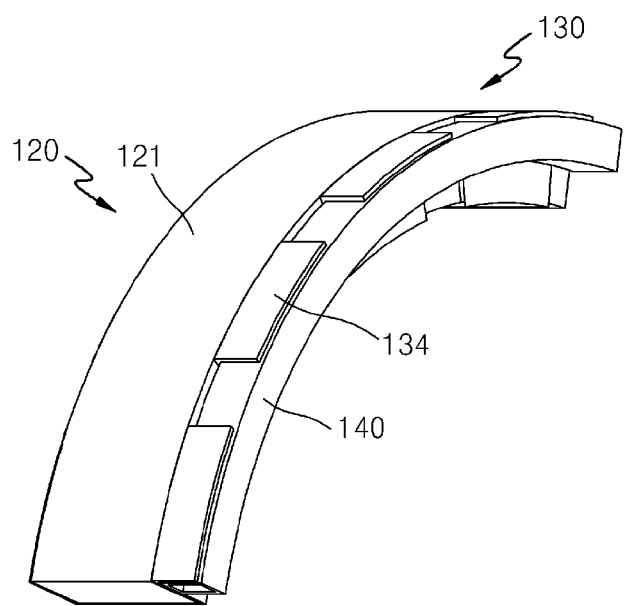
FIG. 5 shows a superconducting magnet cooling module combined with the superconducting coil according to invention principles.
Figure 6:
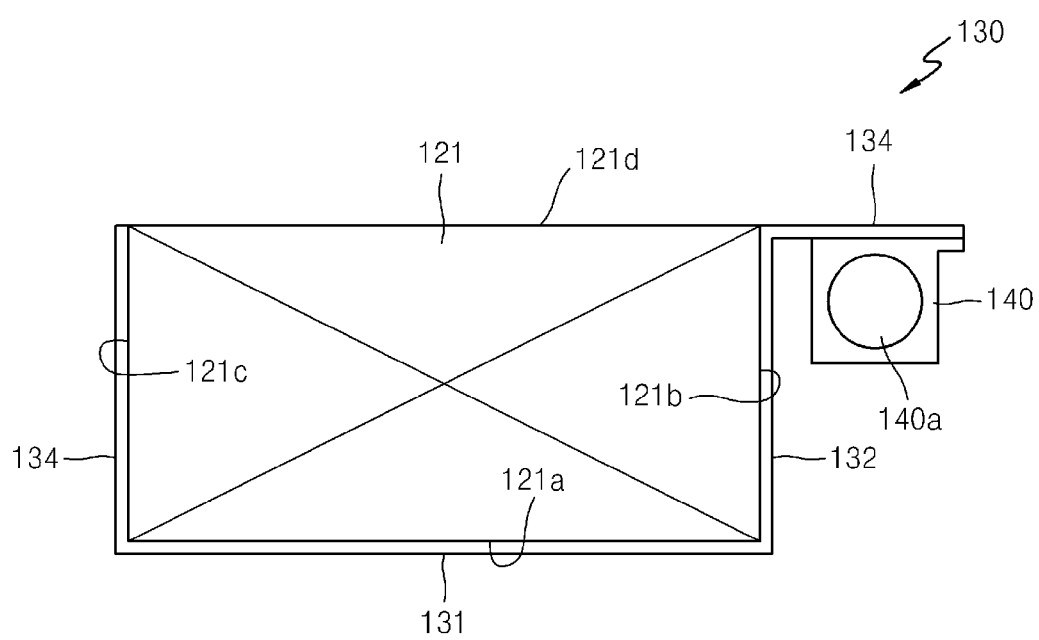
FIG. 6 shows a cross-sectional view of the superconducting magnet cooling module combined with the superconducting coil according to invention principles.

FIG. 3 shows a heat shunt 130 for cooling the superconducting coil 121 of FIG. 2, FIG. 4 shows a superconducting magnet cooling module in which a cooling channel 140 is combined with the heat shunt 130 of FIG. 3, FIG. 5 is a diagram of the superconducting magnet cooling module combined with the superconducting coil 121, and FIG. 6 shows a cross-sectional view of the superconducting magnet cooling module combined with the superconducting coil 121.

Referring to FIGS. 3 through 6, the superconducting magnet cooling module is an indirect cooling type that does not cool down the superconducting coil 121 by directly contacting the superconducting coil 121 with a refrigerant. Rather, the superconducting magnet cooling module includes heat shunt 130 and cooling channel 140. The heat shunt 130 is attached to the superconducting coil 121 and transfers heat from the superconducting coil 121 to the cooling channel 140. The heat shunt 130 is electrically insulated from the superconducting wire of the superconducting coil 121. For example, the resin impregnating the superconducting wire may operate as an insulator between the superconducting coil 121 and the heat shunt 130.

The heat shunt 130 may have a bent plate shape. As shown in FIG. 6, when the cross section of the ring shape of the superconducting coil 121 is rectangular, the heat shunt 130 may have contact portions 131, 132, and 133 to be attached to an inner surface 121a and two side surfaces 121b and 121c of the superconducting coil 121. The contact portions 131 through 133 may be formed by bending a plate. As such, since the contact portions 131 through 133 of the heat shunt 130 thermally contact a wide area of the superconducting coil 121 including the inner surface 121a and the side surfaces 121b and 121c, cooling efficiency is improved. Further, a portion of the heat shunt 130 contacting the superconducting coil 121 includes the inner surface 121a of the superconducting coil 121. This contact provides stable thermal behavior by effectively cooling an inner side of the superconducting coil 121, which is not easily cooled down.

As shown in FIGS. 3 through 5, the heat shunt 130 may include strip plates 130A that are bent and arranged in parallel along the superconducting coil 121. The strip plates 130A are spaced apart from each other and are electrically insulated from each other. As such, instead of forming the heat shunt 130 in one plate, the heat shunt 130 may be formed of the strip plates 130A separated from each other, thereby advantageously reducing eddy currents induced by a magnetic field generated in the superconducting coil 121.

The superconducting coil 121 may be formed by winding the superconducting wire on a mandrel and impregnating the mandrel in a resin. The heat shunt 130 may be mounted irrespective of manufacturing process used in manufacturing the superconducting coil 121. For example, while manufacturing the superconducting coil 121, the heat shunt 130 is positioned on the mandrel, the superconducting wire is wound thereon, and the heat shunt 130 and the superconducting wire are impregnated in resin together, thereby integrally fixing the heat shunt 130 to the superconducting coil 121. Alternatively, the superconducting wire may be wound around the mandrel and impregnated in resin to prepare the superconducting coil 121, and the heat shunt 130 may be attached to the superconducting coil 121. If the heat shunt 130 is attached subsequent to the superconducting wire being impregnated, the heat shunt 130 may be separated and replaced if the heat shunt 130 is damaged. Meanwhile, since the heat shunt 130 may be positioned between the superconducting coil 121 and the mandrel, the heat shunt 130 may be advantageously used for ground plane insulation between the superconducting coil 121 and the mandrel. For example, when the heat shunt 130 is formed of aluminum, a surface of the heat shunt 130 may be anodized for insulation so that the heat shunt 130 is used for ground plane insulation.

Also, the heat shunt 130 further includes a protruding portion 134 that externally bends and extends at one end of the contact portion 132. The protruding portion 134 of the heat shunt 130 closely contacts the cooling channel 140 for thermal contact. Moreover, a part of the contact portion 132 of the heat shunt 130 also closely contacts the cooling channel 140 for thermal contact, thereby increasing a contact area between the heat shunt 130 and the cooling channel 140, and thus cooling efficiency is further improved.

The heat shunt 130 may be formed of a thermal conductor having excellent thermal conductivity. For example, the heat shunt 130 may be formed of a metal, such as copper or high purity aluminum. Moreover, the heat shunt 130 may be flexible. For example, the heat shunt 130 may be a copper or aluminum thin plate to obtain flexibility. As such, since the heat shunt 130 is flexible, the contact portions 131 through 133 of the heat shunt 130 are closely attached to an arbitrary outer surface of the superconducting coil 121, and thus cooling is improved. Moreover, the protruding portion 134 is also formed of a thin thermally conductive metal plate to closely adhere to the cooling channel 140, such that heat is effectively transferred. The cooling channel 140 contacts the protruding portion 134 of the heat shunt 130 to cool down the heat shunt 130. The cryocooler 150 is connected to the other side of the heat shunt 130.

A fluid path 140*a* of the refrigerant may be formed in the cooling channel 140. The refrigerant, such as liquid helium, may flow in the fluid path 140*a* of the cooling channel 140. The refrigerant cooled down in the cryocooler 150 convects (i.e., thermally moves) through the cooling channel 140 based on thermosiphon action, and cools down the superconducting coil 121 via conduction cooling through the heat shunt 130. Thermosiphon is a physics property comprising a method of passive heat exchange based on natural convection, involving circulating a substance without the necessity of a mechanical pump Here, the cooling channel 140 may be formed of a conductive material or a relatively nonconductive material. The conductive material may be a metal, such as steel, copper, or aluminum. The relatively nonconductive material may be a metal, such as stainless steel, or an electric insulating material, such as alumina. By using the relatively nonconductive material, an eddy current generated according to a change of a magnetic field generated in the superconducting coil 121 may be formed relatively small or may not be formed.

When the cooling channel 140 is formed of a conductive material, an eddy current reducing section may be inserted in the cooling channel 140 in a length direction in order to reduce the eddy current generated due to the change of magnetic field generated in the superconducting coil 121. The eddy current reducing section may be formed of a relatively nonconductive material, such as a material like stainless steel, or an electric insulating material like alumina.

The superconducting magnet cooling module is an indirect cooling type wherein the refrigerant does not directly contact the superconducting coil 121 and the cooling channel 140 is filled with liquid helium. Thus, the superconducting magnet cooling module does not require a separate helium tank (bath) for containing the superconducting coil 121, and an amount of the liquid helium for cooling may be reduced. Also, the superconducting magnet cooling module effectively uses a small amount of liquid helium unlike a conduction cooling method or cryogen-free method that does not use liquid helium, thereby realizing a superconducting magnet that has an applicable level of stability.

Different methods of combining the heat shunt 130 and the cooling channel 140 may be employed in response to type of material comprising heat shunt 130 and the cooling channel 140. For example, the heat shunt 130 and the cooling channel 140 may be combined via soldering, welding, bolting, riveting, or by using an adhesive. The contact portions 131 through 133 of the heat shunt 130 are attached to three surfaces, i.e., the inner surface 121*a* and the two side surfaces 121*b* and 121*c*, of the superconducting coil 121. However in other embodiments, since the heat shunt 130 is flexible, the heat shunt 130 may be attached to any one or two of the inner surface 121*a* and the two side surfaces 121*b* and 121*c*, or may be attached to four surfaces of the superconducting coil 121, i.e., the inner surface 121*a*, the two side surfaces 121*b* and 121*c*, and an outer surface 121*d*. The cooling channel 140 has the fluid path 140*a* for the refrigerant. However, in other embodiments the cooling channel 140 may be entirely formed of a thermally conductive material (for example, a metal such as copper or high purity aluminum) to transfer cooling of the cryocooler 150 to the heat shunt 130 in a conductive method.

The superconducting magnet apparatus 100 is an MRI apparatus, but may alternatively be another type of superconducting apparatus. For example, the superconducting magnet apparatus 100 may be a nuclear magnetic resonance (NMR) apparatus or a superconducting magnet apparatus for a magnetic levitation car.

A superconducting magnet system provides an improved cooling efficiency using an indirect cooling type refrigerator. While one or more embodiments have been described with reference to the figures, it will be understood by those of ordinary skill in the art that various changes in form and details may be made as defined by the following claims. The above-described embodiments can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C. 112, sixth paragraph, unless the element is expressly recited using the phrase "means for."

What is claimed is:

1. A superconducting magnet apparatus comprising:
    a superconducting coil;
    a superconducting magnet cooling module comprising a heat shunt for thermally contacting the superconducting coil, and a cooling channel to cool the heat shunt by contacting the heat shunt; and
    a refrigerator to cool the cooling channel,
    wherein the heat shunt comprises a contact portion surrounding at least a part of a surface of the superconducting coil, and a protruding portion externally extending from the contact portion to contact the cooling channel, and the heat shunt further includes a plurality of strip plates arranged in parallel along the superconducting coil, and wherein the contact portion and the protruding portion are parts of each of the plurality of strip plates.

2. The superconducting magnet apparatus of claim 1, wherein the heat shunt comprises a thin plate and is bent to conform to an external shape of the superconducting coil.

3. The superconducting magnet apparatus of claim 1, wherein a cross section of the superconducting coil has a rectangular ring shape, and the contact portion of the heat shunt is attached to at least one of, an inner surface, two side surfaces, and an outer surface, of the superconducting coil.

4. The superconducting magnet apparatus of claim 1, wherein the heat shunt is formed of a thermal conductor.

5. The superconducting magnet apparatus of claim 4, wherein the heat shunt is made of at least one of, copper and aluminum.

6. The superconducting magnet apparatus of claim 1, wherein the heat shunt is flexible.

7. The superconducting magnet apparatus of claim 1, wherein a fluid path for a refrigerant is formed in the cooling channel.

8. The superconducting magnet apparatus of claim 7, wherein the refrigerant is liquid helium.

9. The superconducting magnet apparatus of claim 7, wherein the cooling channel is formed of a thermally conductive material.

10. The superconducting magnet apparatus of claim 9, wherein an eddy current reducing section for reducing an eddy current by a magnetic field generated in the superconducting coil is incorporated in the cooling channel in a length direction.

11. The superconducting magnet apparatus of claim 10, wherein the eddy current reducing section is formed of a relatively electrically nonconductive material compared to electrically conductive material forming the cooling channel.

12. The superconducting magnet apparatus of claim 11, wherein the relatively electrically nonconductive material is stainless steel or alumina.

13. The superconducting magnet apparatus of claim 7, wherein the cooling channel is formed of a relatively electrically nonconductive material.

14. The superconducting magnet apparatus of claim 1, wherein the cooling channel is formed of a thermally conductive material.

15. The superconducting magnet apparatus of claim 1, being a magnetic resonance imaging (MRI) apparatus.

16. A superconducting magnet apparatus comprising:
a superconducting coil;
a superconducting magnet cooling module comprising a heat shunt to thermally contact the superconducting coil, and a cooling channel to cool the heat shunt by contacting the heat shunt, the cooling channel incorporating an eddy current reducing section to reduce an eddy current by a magnetic field generated in the superconducting coil; and
a refrigerator to cool the cooling channel,
wherein the heat shunt comprises a contact portion surrounding at least a part of a surface of the superconducting coil, and a protruding portion externally extending from the contact portion to contact the cooling channel.

17. The superconducting magnet apparatus of claim 16, wherein the heat shunt comprises a thin plate and is bent to conform to an external shape of the superconducting coil.

18. The superconducting magnet apparatus of claim 16, wherein a cross section of the superconducting coil has a rectangular ring shape, and the contact portion of the heat shunt is attached to at least one of, an inner surface, two side surfaces, and an outer surface, of the superconducting coil.

19. The superconducting magnet apparatus of claim 16, wherein the heat shunt comprises a plurality of strip plates arranged in parallel along the superconducting coil.

* * * * *